US005814527A

United States Patent [19]
Wolstenholme et al.

[11] Patent Number: 5,814,527
[45] Date of Patent: Sep. 29, 1998

[54] METHOD OF MAKING SMALL PORES DEFINED BY A DISPOSABLE INTERNAL SPACER FOR USE IN CHALCOGENIDE MEMORIES

[75] Inventors: Graham R. Wolstenholme, Boise; Steven T. Harshfield, Emmett; Raymond A. Turi, Boise; Fernando Gonzalez, Boise; Guy T. Blalock, Boise; Donwon Park, Boise, all of Id.

[73] Assignee: Micron Technology, Inc., Boise, Id.

[21] Appl. No.: 686,174

[22] Filed: Jul. 22, 1996

(Under 37 CFR 1.47)

[51] Int. Cl.⁶ .................................................. H01L 21/00
[52] U.S. Cl. .................................................. 438/5; 438/95
[58] Field of Search ............................. 438/5, 6, 95, 483, 438/602

[56] References Cited

U.S. PATENT DOCUMENTS

| | | | |
|---|---|---|---|
| 3,423,646 | 1/1969 | Cubert et al. | 317/234 |
| 3,796,926 | 3/1974 | Cole et al. | 317/234 R |
| 4,099,260 | 7/1978 | Lynes et al. | 365/105 |
| 4,115,872 | 9/1978 | Bluhm | 365/163 |
| 4,174,521 | 11/1979 | Neale | 357/45 |
| 4,194,283 | 3/1980 | Hoffmann | 29/571 |
| 4,203,123 | 5/1980 | Shanks | 357/2 |
| 4,227,297 | 10/1980 | Angerstein | 29/571 |
| 4,272,562 | 6/1981 | Wood | 427/87 |
| 4,458,260 | 7/1984 | McIntyre et al. | 357/30 |
| 4,502,208 | 3/1985 | McPherson | 29/584 |
| 4,569,698 | 2/1986 | Feist | 148/1.5 |
| 4,630,355 | 12/1986 | Johnson | 438/6 |
| 4,642,140 | 2/1987 | Noufi et al. | 438/95 |
| 4,757,359 | 7/1988 | Chiao et al. | 357/23.5 |
| 4,804,490 | 2/1989 | Pryor et al. | 252/62.3 BT |
| 4,809,044 | 2/1989 | Pryor et al. | 357/2 |
| 4,823,181 | 4/1989 | Mohsen et al. | 357/51 |
| 4,876,220 | 10/1989 | Mohsen et al. | 437/170 |
| 4,876,668 | 10/1989 | Thakoor et al. | 365/163 |
| 4,881,114 | 11/1989 | Mohsen et al. | 357/54 |
| 4,892,840 | 1/1990 | Esquivel et al. | 437/52 |
| 5,144,404 | 9/1992 | Iranmanesh et al. | 357/51 |
| 5,166,096 | 11/1992 | Cote et al. | 437/195 |
| 5,166,758 | 11/1992 | Ovshinsky et al. | 257/3 |
| 5,177,567 | 1/1993 | Klersy et al. | 257/4 |
| 5,296,716 | 3/1994 | Ovshinsky et al. | 257/3 |
| 5,335,219 | 8/1994 | Ovshinsky et al. | 369/288 |
| 5,341,328 | 8/1994 | Ovshinsky et al. | 365/163 |
| 5,359,205 | 10/1994 | Ovshinsky | 257/3 |
| 5,510,629 | 4/1996 | Karpovich et al. | 257/50 |

FOREIGN PATENT DOCUMENTS

| | | |
|---|---|---|
| 0 117 045 | 8/1984 | European Pat. Off. . |
| 60.109266 | 6/1985 | Japan . |
| 1 319 388 | 6/1973 | United Kingdom . |

OTHER PUBLICATIONS

Kim and Kim, "Effects of High–Current Pulses on Polycrystalline Silicon Diode with n–type Region Heavily Doped with Both Boron and Phosphorus," *J. Appl. Phys.*, 53(7):5359–5360, 1982.

Neale and Aseltine, "The Application of Amorphous Materials to Computer Memories," *IEEE*, 20(2):195–205, 1973.

Pein and Plummer, "Performance of the 3–D Sidewall Flash EPROM Cell," *IEEE*, 11–14, 1993.

(List continued on next page.)

*Primary Examiner*—Chandra Chaudhari
*Attorney, Agent, or Firm*—Fletcher, Yoder & Edwards

[57] ABSTRACT

A method for fabricating an ultra-small pore or contact for use in chalcogenide memory cells specifically and in semiconductor devices generally in which disposable spacers are utilized to fabricate ultra-small pores or contacts. The pores thus defined have minimum lateral dimensions ranging from approximately 500 to 4000 Angstroms. The pores thus defined may then be used to fabricate a chalcogenide memory cell or other semiconductor devices.

38 Claims, 14 Drawing Sheets

OTHER PUBLICATIONS

Post and Ashburn, "Investigation of Boron Diffusion in Polysilicon and its Application to the Design of p–n–p Polysilicon Emitter Bipolar Transistors with Shallow Emitter Junctions," *IEEE*, 38(11):2442–2451, 1991.

Post et al., "Polysilicon Emitters for Bipolar Transistors: A Review and Re–Evaluation of Theory and Experiment," *IEEE*, 39(7):1717–1731, 1992.

Post and Ashburn, "The Use of an Interface Anneal to Control the Base Current and Emitter Resistance of p–n–p Polysilicon Emitter Bipolar Transistors," *IEEE*, 13(8):408–410, 1992.

Rose et al., "Amorphous Silicon Analogue Memory Devices," *J. Non–Crystalline Solids*, 115:168–170, 1989.

Schaber et al., "Laser Annealing Study of the Grain Size Effect in Polycrystalline Silicon Schottky Diodes," *J. Appl. Phys.*, 53(12):8827–8834, 1982.

Yamamoto et al., "The I–V Characteristics of Polycrystalline Silicon Diodes and the Energy Distribution of Traps in Grain Boundaries," *Electronics and Communications in Japan*, Part 2, 75(7):51–58, 1992.

Yeh et al., "Investigation of Thermal Coefficient for Polycrystalline Silicon Thermal Sensor Diode," *Jpn. J. Appl. Phys.*, 31(Part 1, No. 2A):151–155, 1992.

Oakley et al., "Pillars—The Way to Two Micron Pitch Multilevel Metallisation," *IEEE*, 23–29, 1984.

METHOD OF MAKING SMALL PORES
DEFINED BY A DISPOSABLE INTERNAL
SPACER FOR USE IN CHALCOGENIDE
MEMORIES

BACKGROUND OF THE INVENTION

The present invention relates generally to semiconductor fabrication techniques and, more particularly, to a method for fabricating ultra-small pores for use in phase or state changeable memory devices such as, for example, chalcogenide memory cells.

The use of electrically writable and erasable phase change materials (i.e., materials which can be electrically switched between generally amorphous and generally crystalline states or between different resistive states while in crystalline form) for electronic memory applications is known in the art and is disclosed, for example, in U.S. Pat. No. 5,296,716 to Ovshinsky et al., the disclosure of which is incorporated herein by reference. U.S. Pat. No. 5,296,716 is believed to indicate generally the state of the art, and to contain a discussion of the current theory of operation of chalcogenide materials.

Generally, as disclosed in the aforementioned Ovshinsky patent, such phase change materials can be electrically switched between a first structural state where the material is generally amorphous and a second structural state where the material has a generally crystalline local order. The material may also be electrically switched between different detectable states of local order across the entire spectrum between the completely amorphous and the completely crystalline states. That is, the switching of such materials is not required to take place between completely amorphous and completely crystalline states but rather the material can be switched in incremental steps reflecting changes of local order to provide a "gray scale" represented by a multiplicity of conditions of local order spanning the spectrum from the completely amorphous state to the completely crystalline state.

The material exhibits different electrical characteristics depending upon its state. For instance, in its amorphous state the material exhibits a lower electrical conductivity than it does in its crystalline state.

These memory cells are monolithic, homogeneous, and formed of chalcogenide material selected from the group of Te, Se, Sb, Ni, and Ge. Such chalcogenide materials can be switched between numerous electrically detectable conditions of varying resistivity in nanosecond time periods with the input of picojoules of energy. The resulting memory material is truly non-volatile and will maintain the integrity of the information stored by the memory cell without the need for periodic refresh signals. Furthermore, the data integrity of the information stored by these memory cells is not lost when power is removed from the device. The subject memory material is directly overwritable so that the memory cells need not be erased (set to a specified starting point) in order to change information stored within the memory cells. Finally, the large dynamic range offered by the memory material provides for the gray scale storage of multiple bits of binary information in a single cell by mimicking the binary encoded information in analog form and thereby storing multiple bits of binary encoded information as a single resistance value in a single cell.

The operation of chalcogenide memory cells requires that a region of the chalcogenide memory material, called the chalcogenide active region, be subjected to a current pulse typically with a current density between about $10^5$ and $10^7$ amperes/cm$^2$, to change the crystalline state of the chalcogenide material within the active region contained within a small pore. This current density may be accomplished by first creating a small opening in a dielectric material which is itself deposited onto a lower electrode material. A second dielectric layer, typically of silicon nitride, is then deposited onto the dielectric layer and into the opening. The second dielectric layer is typically on the order of 40 Angstroms thick. The chalcogenide material is then deposited over the second dielectric material and into the opening. An upper electrode material is then deposited over the chalcogenide material. Carbon is a commonly used electrode material, although other materials have also been used, for example, molybdenum and titanium nitride. A conductive path is then provided from the chalcogenide material to the lower electrode material by forming a pore in the second dielectric layer by the well known process of firing. Firing involves passing an initial high current pulse through the structure which passes through the chalcogenide material and then provides dielectric breakdown of the second dielectric layer, thereby providing a conductive path via the pore through the memory cell.

Electrically firing the thin silicon nitride layer is not desirable for a high density memory product due to the high current required and the large amount of testing time that is required for the firing.

The active regions of the chalcogenide memory cells within the pores are believed to change crystalline structure in response to applied voltage pulses of a wide range of magnitudes and pulse durations. These changes in crystalline structure alter the bulk resistance of the chalcogenide active region. The wide dynamic range of these devices, the linearity of their response, and lack of hysteresis provide these memory cells with multiple bit storage capabilities.

Factors such as pore dimensions (diameter, thickness, and volume), chalcogenide composition, signal pulse duration and signal pulse waveform shape have an effect on the magnitude of the dynamic range of resistances, the absolute endpoint resistances of the dynamic range, and the currents required to set the memory cells at these resistances. For example, relatively large pore diameters (e.g., about 1 micron) will result in higher programming current requirements, while relatively small pore diameters (e.g., about 500 Angstroms) will result in lower programming current requirements. The most important factor in reducing the required programming current is the pore cross sectional area.

The energy input required to adjust the crystalline state of the chalcogenide active region of the memory cell is directly proportional to the dimensions of the minimum lateral dimension of the pore (e.g., smaller pore sizes result in smaller energy input requirement). Conventional chalcogenide memory cell fabrication techniques provide a minimum lateral pore dimension, diameter or width of the pore, that is limited by the photolithographic size limit. This results in pore sizes having minimum lateral dimensions down to approximately 0.35 micron.

The present invention is directed to overcoming, or at least reducing the affects of, one or more of the problems set forth above. In particular, the present invention provides a method for fabricating ultra-small pores for chalcogenide memory cells with minimum lateral dimensions below the photolithographic limit thereby reducing the required energy input to the chalcogenide active region in operation. The present invention further eliminates the unpredictable prior art method of pore formation by electrical breakdown of a thin silicon nitride layer to form a small pore. As a result, the memory cells may be made smaller to provide denser memory arrays, and the overall power requirements for the memory cell are minimized. The present invention has further application to semiconductor devices generally as it affords a means of fabricating ultra-small contacts or vias thereby permitting further reduction in the size of semiconductor devices generally.

SUMMARY OF THE INVENTION

In accordance with one aspect of the present invention, a method for fabricating an ultra-small pore is provided in which a layer of a first material is applied onto a substrate material. An edge feature is then formed in the layer of the first material. A layer of a second material is then applied to the edge feature of the layer of the first material. The second material preferably comprises a insulative material while the substrate material comprises a conductive material. A layer of a third material is then applied to the layer of the second material. A portion of the layer of the third material is then removed. A portion of the layer of the second material is then removed to define a pore in the layer of the second material. The remaining portion of the third layer of material is then removed to facilitate further processing steps.

In accordance with another aspect of the present invention, a method for fabricating an ultra-small pore is provided in which a layer of a first material is first applied onto a substrate material. The first material preferably comprises a insulative material while the substrate material comprises a conductive material. A layer of a second material is then applied onto the layer of the first material. Edge features are then formed in the layers of the first and second materials. A layer of a third material is then applied onto the edge features of the layers of the first and second materials. A portion of the layer of the third material is then removed. A portion of the layer of the first material is then removed to define a pore in the layer of the first material. The remaining portions of the second and third layers are then removed to facilitate further processing steps.

In accordance with yet another aspect of the present invention, a method for fabricating an ultra-small pore is provided in which a layer of a first material is applied onto a substrate material. A layer of a second material is then applied to the layer of the first material. A layer of a third material is then applied to the layer of the second material. An edge feature is then formed in the layer of the third material. A layer of a fourth material is then applied to the edge feature of the layer of the third material. A portion of the layer of the fourth material is then removed. A portion of the layer of the second material is then removed to define a pore in the layer of the second material. A portion of the layer of the first material is then removed to define a pore in the layer of the first material. The remaining portions of the second, third, and fourth layers are then removed to facilitate further processing steps.

The pores thus defined have a minimum lateral dimension ranging from approximately 500 to 4000 Angstroms. The pores thus defined may then be used to fabricate a chalcogenide memory cell by the successive addition of a layer of a chalcogenide material and a layer of a conductive material onto the pore. The pores may further be utilized to fabricated semiconductor devices generally.

DESCRIPTION OF THE DRAWINGS

The present invention will become more fully understood from the following detailed description of the preferred embodiments, taken in conjunction with the accompanying drawings in which.

DETAILED DESCRIPTION OF PREFERRED EMBODIMENTS

A method of fabricating pores is presented that provides pore sizes smaller than that presently provided using conventional photolithographic methods. The method further eliminates the unpredictable results provided by the conventional method of pore formation by dielectric breakdown of a thin silicon nitride layer. In particular, the preferred embodiment of the present invention provides a method of fabricating pores that relies upon disposable spacers to define the minimum lateral dimension of the pore. In this manner, pore sizes having minimum lateral dimensions as small as around 500 Angstroms are obtained. The present preferred embodiment has further application to the fabrication of contacts, also commonly known as vias, in semiconductor devices generally thereby permitting further reductions the architecture of such devices.

Figure 1:
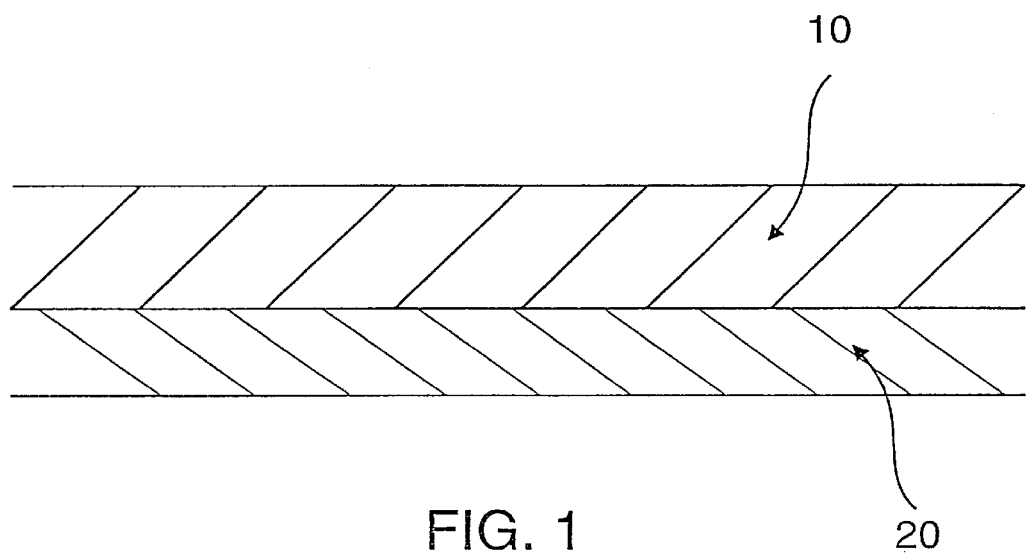
FIG. 1 is a fragmentary cross sectional view of the deposition of a layer of tetraethylorthosilicate (TEOS) oxide onto a substrate of titanium nitride in accordance with a first preferred embodiment of the present invention.

Turning to the drawings and referring initially to FIGS. 1 to 8, a first preferred embodiment of a method for fabricating ultra-small pores will now be described. A layer 10 of tetraethylorthosilicate (TEOS) oxide is first deposited onto a substrate 20 of titanium nitride using convention thin film deposition techniques as shown in FIG. 1. The layer 10 may have a substantially uniform thickness ranging from about 200 to 5000 Angstroms, and preferably it will have a substantially uniform thickness of approximately 200 Angstroms. The layer 10 may be comprised of TEOS oxide or plasma enhanced chemical vapor deposition (PECVD) of $SiO_2$, and preferably will be comprised of TEOS oxide. The substrate 20 may be comprised of a conductive material such as, for example, TiN, Carbon, $WiSi_x$, or Tungsten, and preferably will be comprised of TiN.

Figure 2:
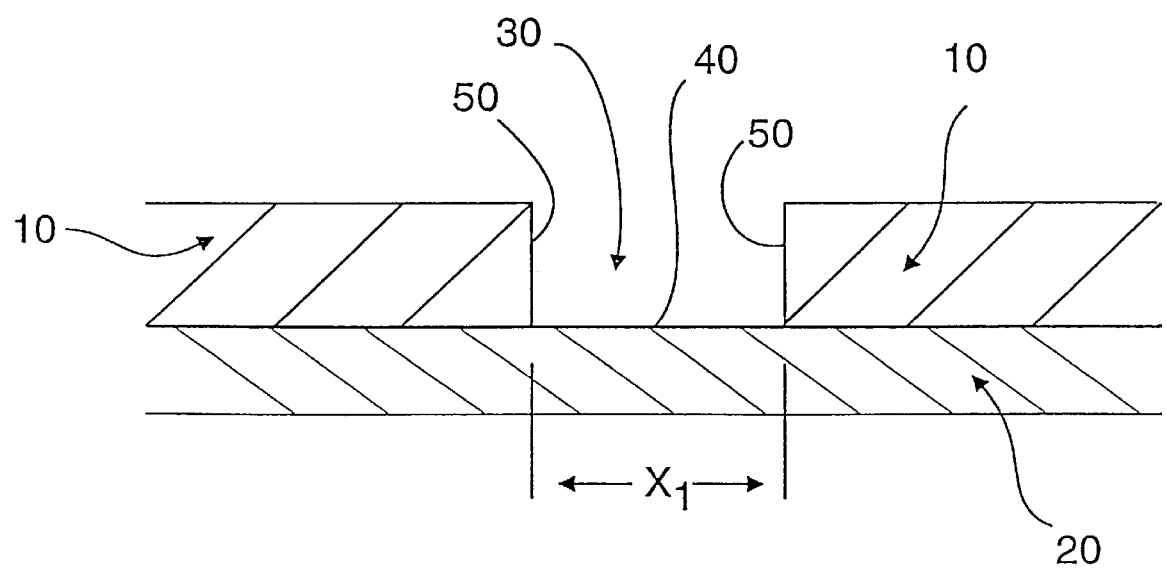
FIG. 2 is a fragmentary cross sectional view of the formation of an opening in the layer of TEOS oxide of FIG. 1.
Figure 2A:
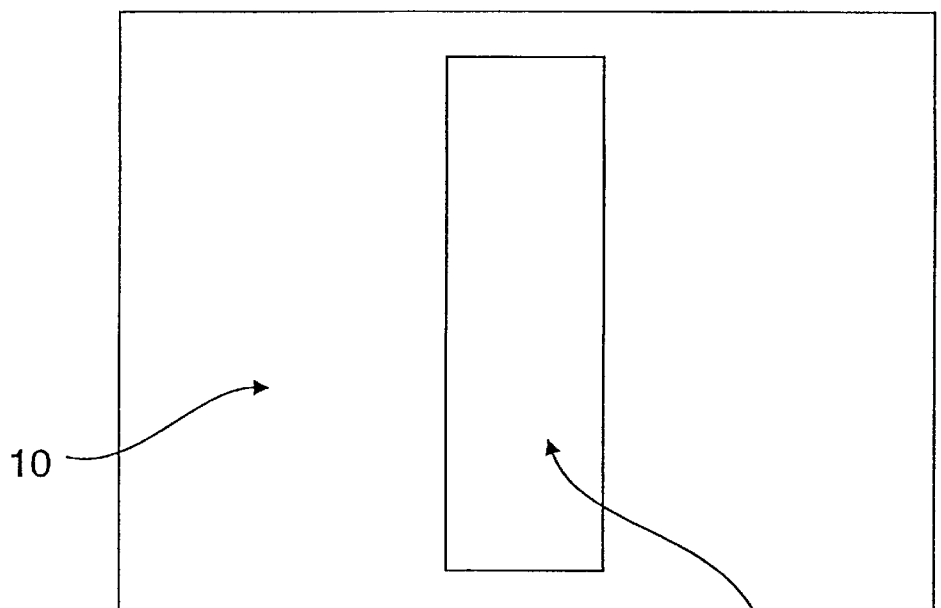
FIG. 2a is an overhead view of a generally rectangular opening formed in the layer of TEOS oxide of FIG. 1.
Figure 2B:
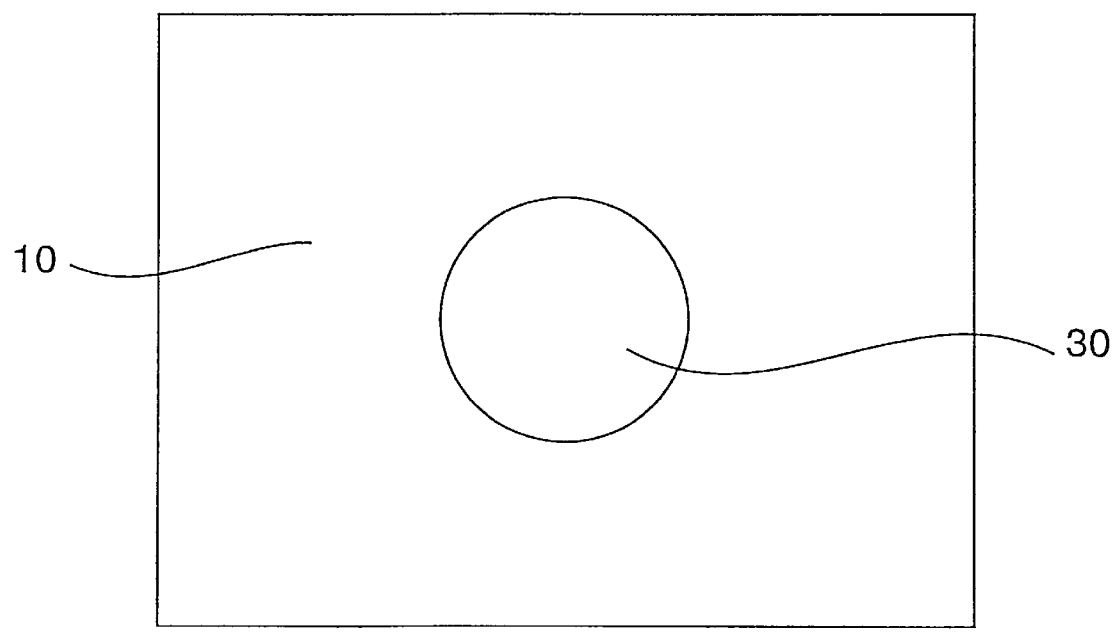
FIG. 2b is an overhead view of a generally circular opening formed in the layer of TEOS oxide of FIG. 1.

An opening 30, extending to the layer 20, is then etched in the layer 10 using conventional anisotropic etching and masking techniques as shown in FIG. 2. The opening 30 may be formed, for example, as a generally rectangular channel as shown in FIG. 2a, or as a substantially circular opening in the layer 10 as shown in FIG. 2b. The opening 30 is preferably formed using a conventional contact hole mask resulting in the substantially circular opening shown in FIG. 2b. The minimum lateral dimension $x_1$ of the opening 30 may range from about 2500 to 8000 Angstroms, and preferably it will be approximately 5000 Angstroms.

The opening 30 includes a generally horizontal bottom surface 40, common to the layer 20, and generally vertical side walls 50 at its outer periphery.

Figure 3:
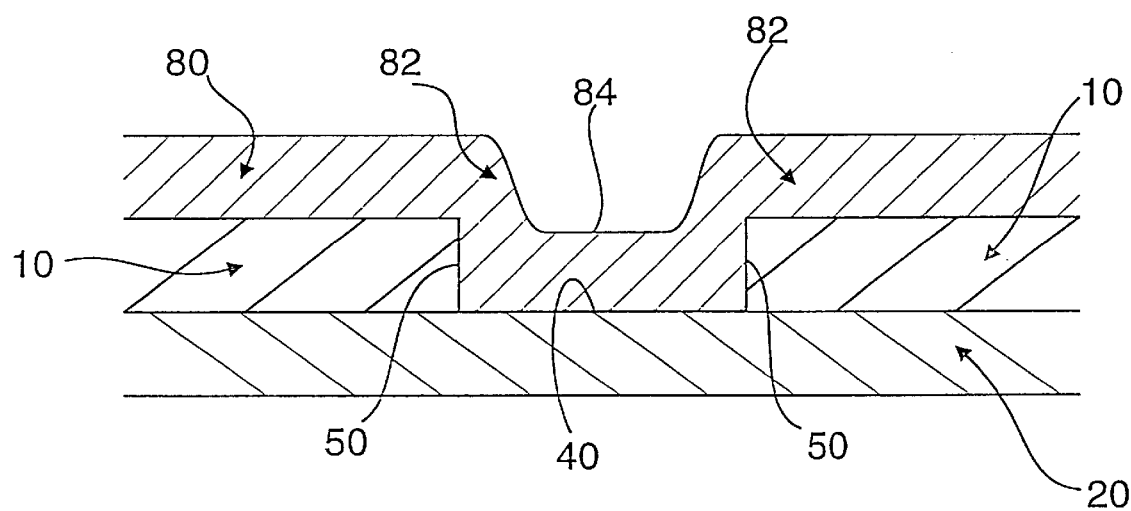
FIG. 3 is a fragmentary cross sectional view of the deposition of a layer of silicon nitride onto the layer of TEOS oxide and into the opening in the layer of TEOS oxide of FIG. 2.
Figure 4:
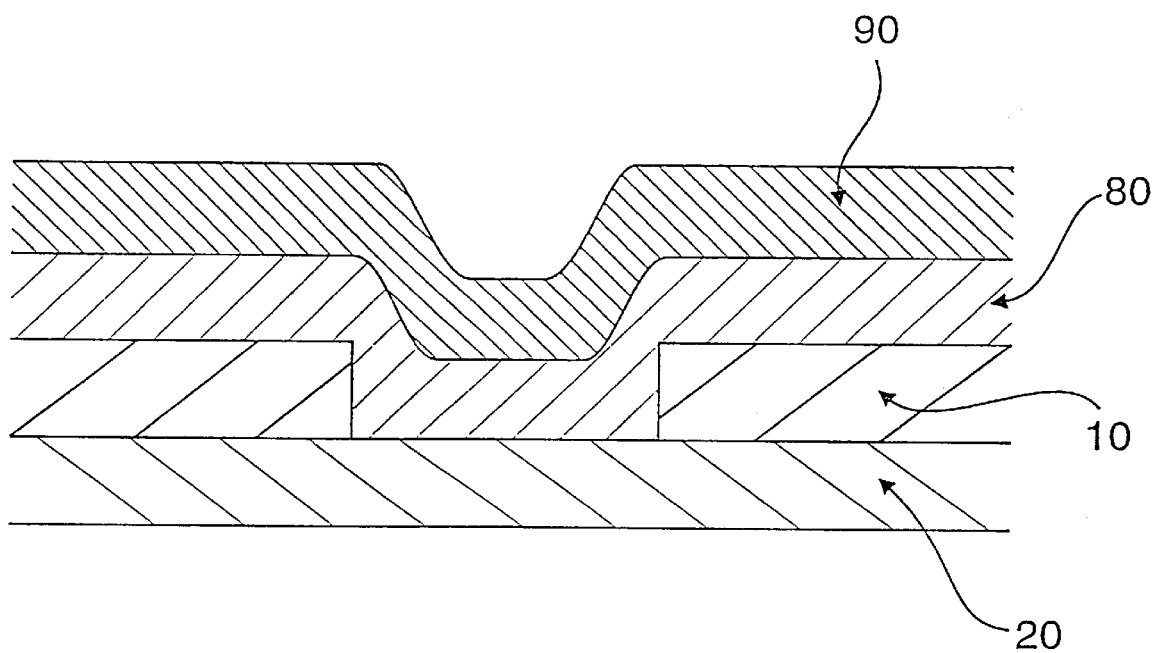
FIG. 4 is a fragmentary cross sectional view of the deposition of a layer of polysilicon onto the layer of silicon nitride and opening of FIG. 3.
Figure 5:
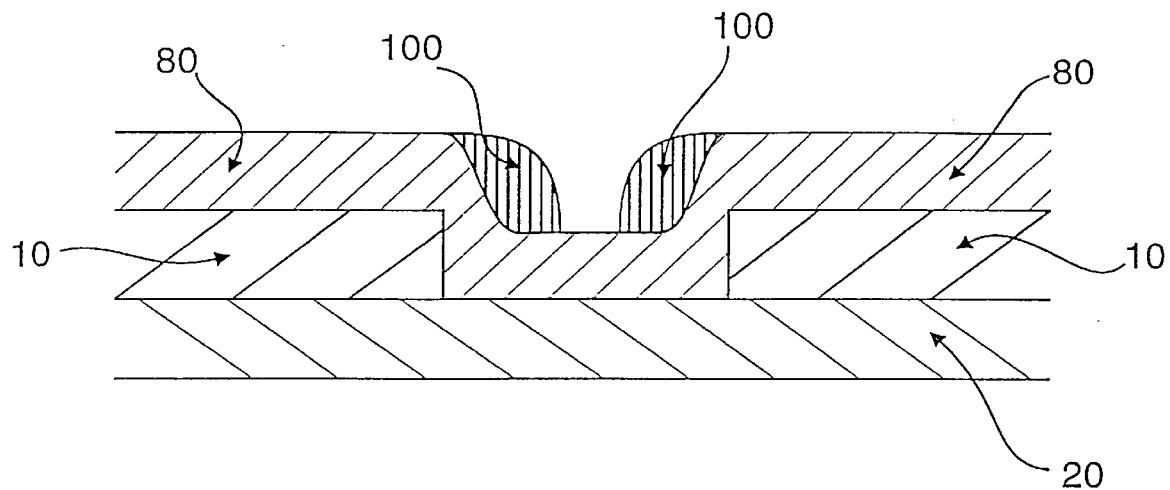
FIG. 5 is a fragmentary cross sectional view of the etching of the layer of polysilicon of FIG. 4 to form a spacer.

A layer 80 of silicon nitride is then deposited onto the layer 10 and bottom surface 40 using conventional thin film deposition techniques as shown in FIG. 3. The portion of the layer 80 positioned within the opening 30 includes generally vertical side walls 82 extending downward to a generally horizontal surface 84. The layer 80 may have a substantially uniform thickness ranging from about 100 to 750 Angstroms, and preferably it will have a substantially uniform thickness of approximately 300 Angstroms. The layer 80 may comprise a dielectric material such as, for example, TEOS oxide, PECVD oxide, or silicon nitride, and preferably it will comprise silicon nitride. A layer 90 of polysilicon is then deposited onto the layer 80 using conventional thin film deposition techniques as shown in FIG. 4. The layer 90 may have a substantially uniform thickness ranging from about 500 to 2500 Angstroms, and preferably it will have a substantially uniform thickness of approximately 1500 Angstroms. The layer 90 may comprise polysilicon or silicon nitride, and preferably it will comprise polysilicon. The layer 90 is then etched using conventional anisotropic etching techniques to form a spacer 100 out of the layer 90 as shown in FIG. 5. The spacer 100 is positioned at the outer periphery of the portion of the layer 80 positioned within the opening 30 and covers the generally vertical side walls 82. The bottom of the spacer 100 will have a lateral thickness substantially equal to the selected thickness of the layer 90 provided the coating of the layer 90 on the layer 80 is conformal.

Figure 6:
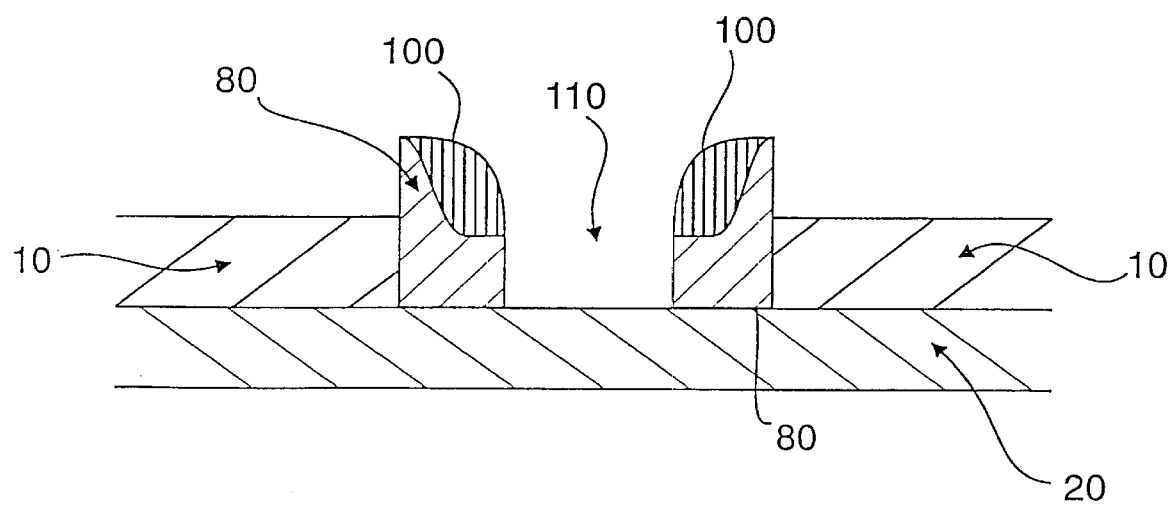
FIG. 6 is a fragmentary cross sectional view of the etching of the exposed portion of the layer of silicon nitride circumscribed by the spacer of FIG. 5 to form an opening in the layer of silicon nitride.
Figure 7:
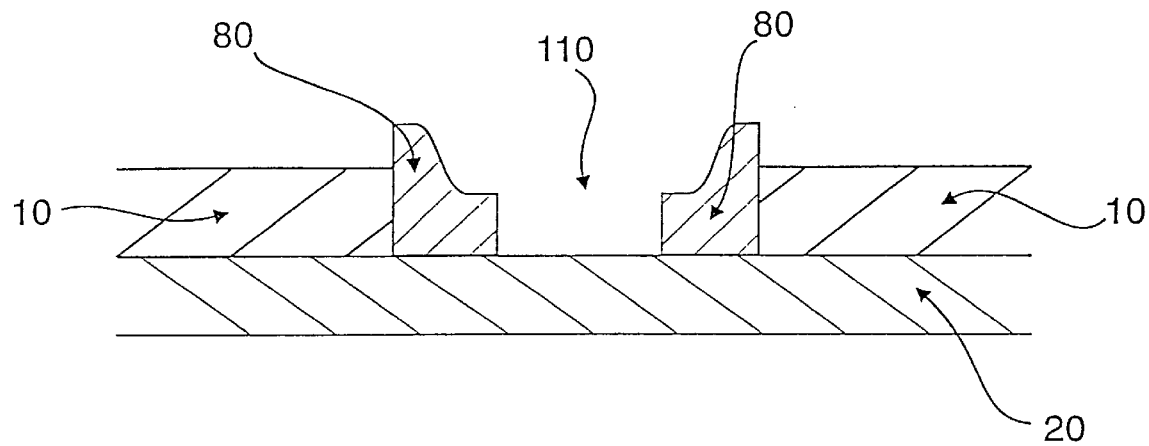
FIG. 7 is a fragmentary cross sectional view of the removal of the spacer of FIG. 6.

The portion of the layer 80 not covered by the spacer 100 is then etched using conventional anisotropic etching techniques to form an opening 110 defining a pore in the layer 80 extending to the layer 20 as shown in FIG. 6. The resulting opening 110 may have a minimum lateral dimension ranging from about 500 to 4000 Angstroms, and preferably it will have a minimum lateral dimension of approximately 1000 Angstroms. The minimum lateral dimension of the opening 110 is defined by the selected thickness of the layer 90 used to form the spacer 100. The spacer 100 is then removed using conventional wet etch techniques as shown in FIG. 7. The disposable spacer 100 thus provides a means of defining the minimum lateral dimension of an ultra-small pore in the layer 80. The first preferred embodiment of the present method thus provides a means of fabricating an ultra-small pore 110 in the layer 80 by use of the disposable spacer 100 positioned adjacent to an edge feature of the layer 80.

Note that while a range of materials may be utilized for each of the layers, the particular materials selected for each of the layers must be selected to provide proper selectivity during the various etching processes as will be recognized by persons of ordinary skill in the art.

Figure 8:
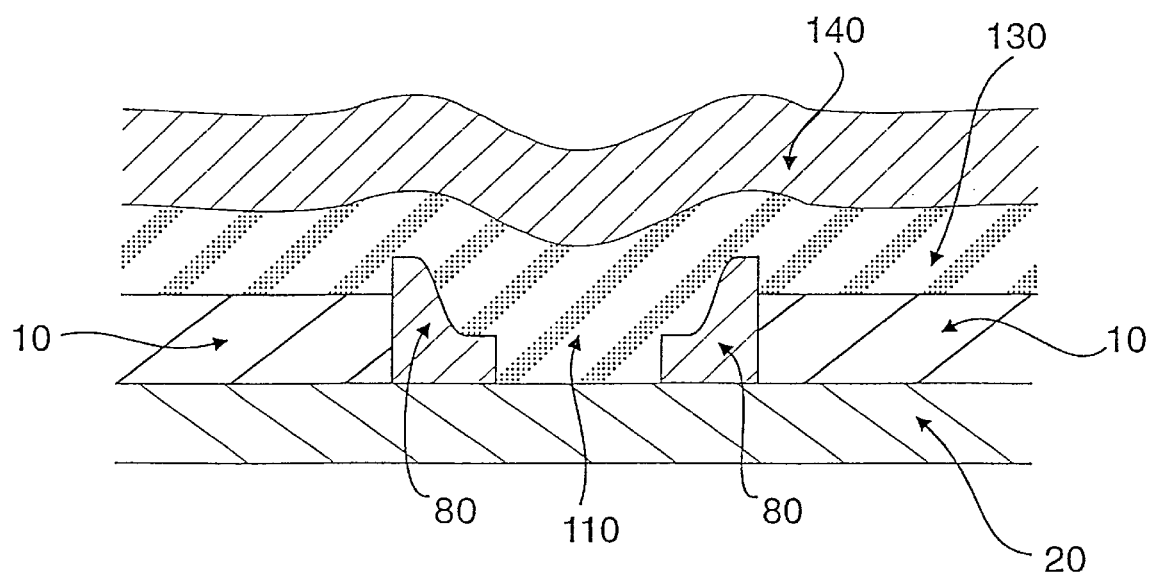
FIG. 8 is a fragmentary cross sectional view of the formation of chalcogenide memory cell using the structure illustrated in FIG. 7.

The resulting structure illustrated in FIG. 7 includes a conductive substrate 20 and a dielectric layer 80 including an opening 110. This structure is preferably used to fabricate a chalcogenide memory cell 120 in which the opening 110 provides a pore for the memory cell 120 as shown in FIG. 8. The memory cell 120 is fabricated by depositing a layer 130 of a chalcogenide material onto the layer 80 into the opening 110 and onto the layer 20 using conventional thin film deposition techniques. A layer 140 of a conductive material such as, for example, titanium nitride is then deposited over the layer 130 using conventional thin film deposition techniques. The layer 140 may comprise a conductive material such as, for example, TiN or Carbon, and preferably it will comprise TiN.

Typical chalcogenide compositions for these memory cells include average concentrations of Te in the amorphous state well below 70%, typically below about 60% and ranging in general from as low as about 23% up to about 56% Te, and most preferably to about 48% to 56% Te. Concentrations of Ge are typically above about 15% and range from a low of about 17% to about 44% average, remaining generally below 50% Ge, with the remainder of the principal constituent elements in this class being Sb. The percentages given are atomic percentages which total 100% of the atoms of the constituent elements. In a particularly preferred embodiment, the chalcogenide compositions for these memory cells comprise a Te concentration of about 55%, a Ge concentration of about 22%, and a Sb concentration of about 22%. This class of materials are typically characterized as $Te_a Ge_b Sb_{100(a+b)}$, where a is equal to or less than about 70% and preferably between about 60% to about 40%, b is above about 15% and less than 50%, preferably between about 17% to about 44%, and the remainder is Sb.

Figure 9:
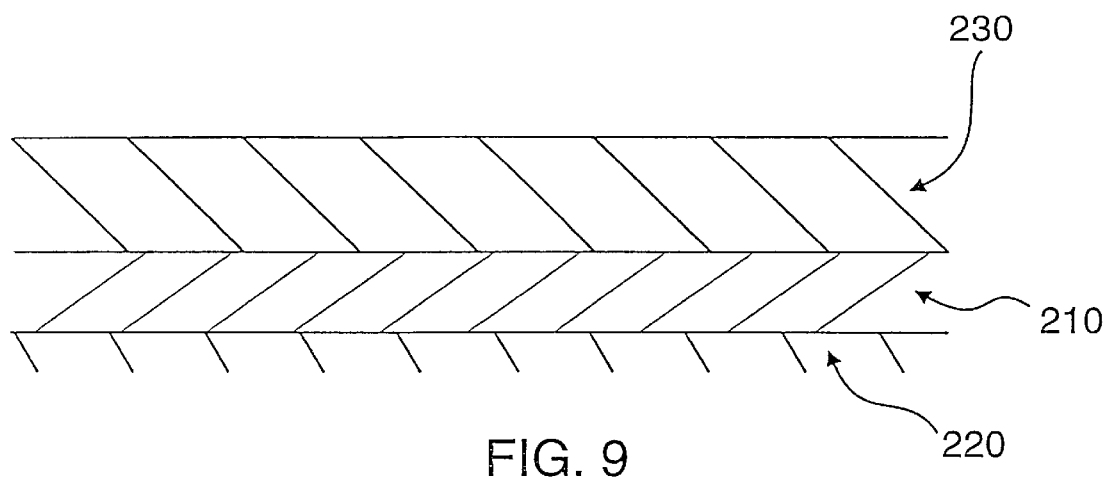
FIG. 9 is a fragmentary cross sectional view of the deposition of layers of silicon nitride and polysilicon onto a substrate of titanium nitride in accordance with a second preferred embodiment of the present invention.

Referring to FIGS. 9 to 15, a second preferred embodiment of a method of fabricating ultra-small pores will now be described. A layer 210 of silicon nitride is first deposited onto a substrate 220 of titanium nitride. A layer 230 of polysilicon is then deposited onto the layer 210. The layers 210 and 230 are deposited using conventional thin film deposition techniques as shown in FIG. 9. The layer 210 may have a substantially uniform thickness ranging from about 50 to 1000 Angstroms, and preferably it will have a substantially uniform thickness of approximately 500 Angstroms. The layer 210 may be comprised of a dielectric material such as, for example, TEOS oxide, silicon nitride, or PECVD oxide, and preferably will be comprised of silicon nitride. The layer 230 may have a substantially uniform thickness ranging from about 1000 to 5000 Angstroms, and preferably it will have a substantially uniform thickness of approximately 4000 Angstroms. The layer 230 may be comprised of TEOS oxide, PECVD oxide, or polysilicon, and preferably will be comprised of polysilicon. The substrate 220 may be comprised of a conductive material such as, for example, TiN, carbon, $WSi_x$ or TiW, and preferably will be comprised of TiN.

Figure 10:
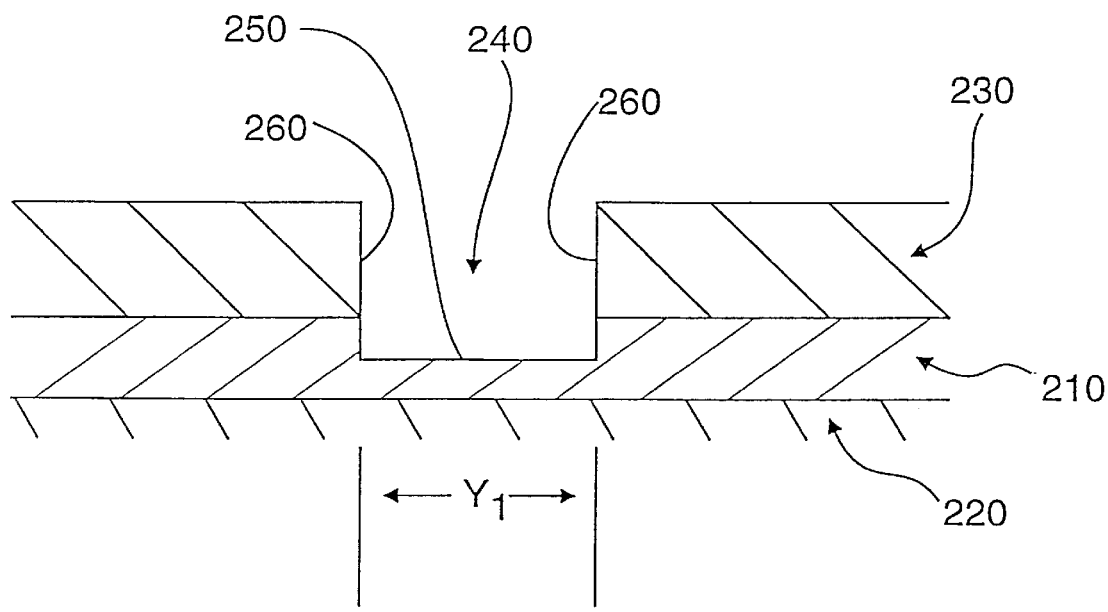
FIG. 10 is a fragmentary cross sectional view of the formation of an opening in the layer of polysilicon and a recess in the layer of silicon nitride of FIG. 9.

An opening 240, extending partially into the layer 210, is then etched in the layers 210 and 230 using conventional anisotropic etching and masking techniques as shown in FIG. 10. The etching process may etch material partially from the layer 210 thereby forming a recess in the layer 210. The opening 240 may be formed, for example, as a rectangular channel or as a substantially circular opening in the layers 210 and 230. The opening 240 is preferably formed using a conventional circular contact hole mask resulting in a substantially circular opening. The minimum lateral dimension $Y_1$ of the opening 240 may range from about 2500 to 8000 Angstroms, and preferably it will be approximately 5000 Angstroms. The opening 240 includes a generally horizontal bottom surface 250 and generally vertical side walls 260 at its outer periphery.

Figure 11:
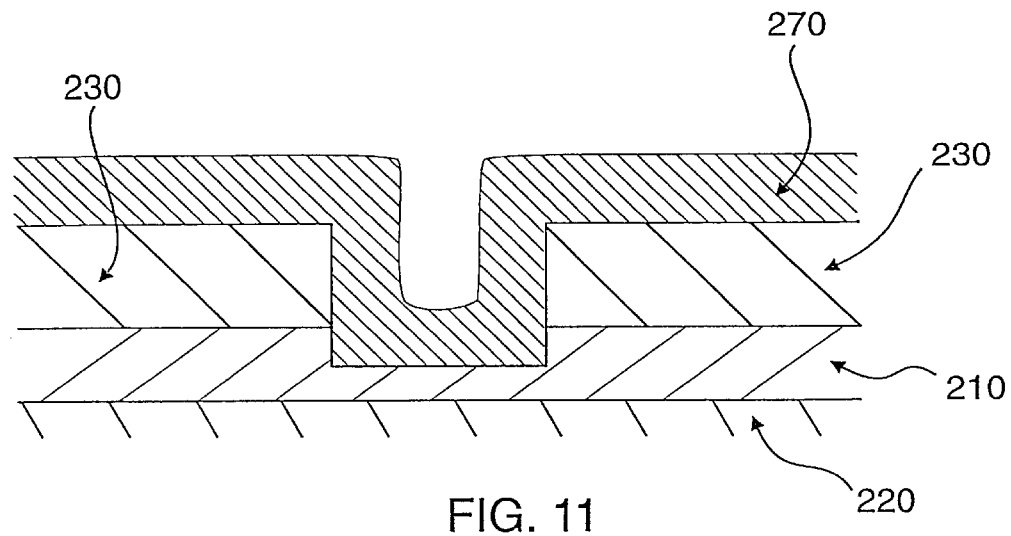
FIG. 11 is a fragmentary cross sectional view of the deposition of a second layer of polysilicon onto the first layer of polysilicon and into the opening in the layer of polysilicon and into the recess in the layer of silicon nitride of FIG. 10.
Figure 12:
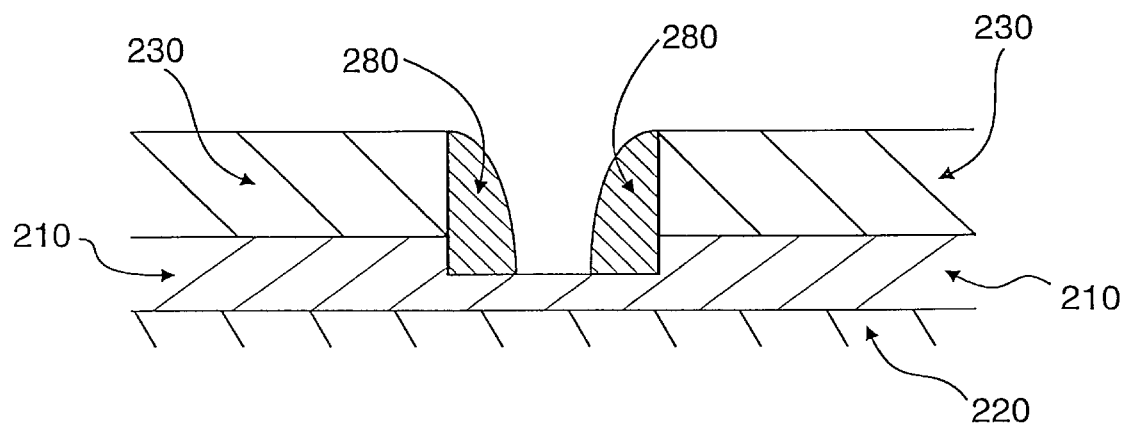
FIG. 12 is a fragmentary cross sectional view of the etching of the second layer of polysilicon of FIG. 11 to form a spacer.

A second layer 270 of polysilicon is then deposited onto the layer 230 and into the opening 240, onto the bottom surface 250 and side walls 260, using conventional thin film deposition techniques as shown in FIG. 11. The layer 270 may have a substantially uniform thickness ranging from about 500 to 3500 Angstroms, and preferably it will have a substantially uniform thickness of approximately 2000 Angstroms. The layer 270 may comprise polysilicon, TEOS oxide, or PECVD oxide, and preferably it will comprise polysilicon. The layer 270 is then etched using conventional anisotropic etching techniques to form a spacer 280 out of the layer 270 as shown in FIG. 12. The spacer 280 is positioned at the outer periphery of the opening 240 and covers the generally vertical side walls 260. The bottom of the spacer 280 will have a lateral thickness substantially equal to the selected thickness of the layer 270 provided the layer 270 conformally coats the layers 210 and 230.

Figure 13:
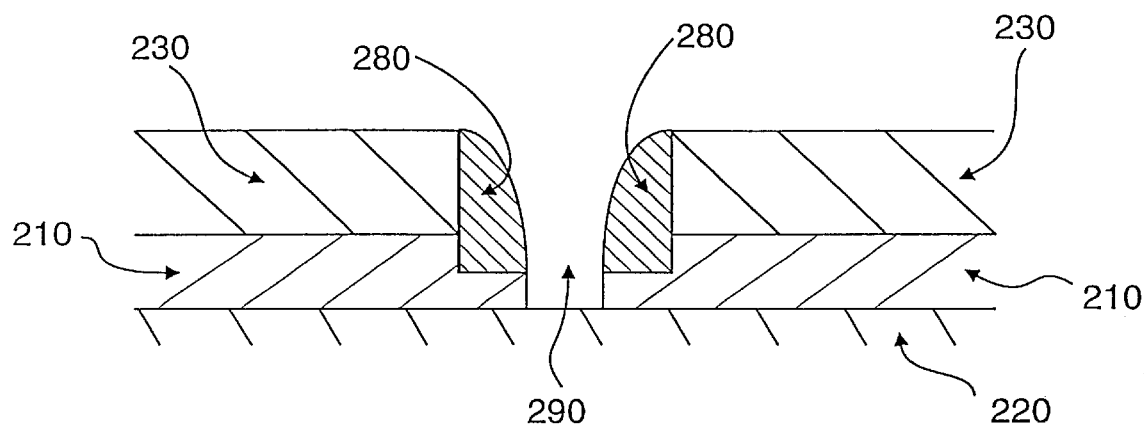
FIG. 13 is a fragmentary cross sectional view of the etching of the portions of the layer of silicon nitride circumscribed by the spacer of FIG. 12 to form an opening in the layer of silicon nitride.
Figure 14:
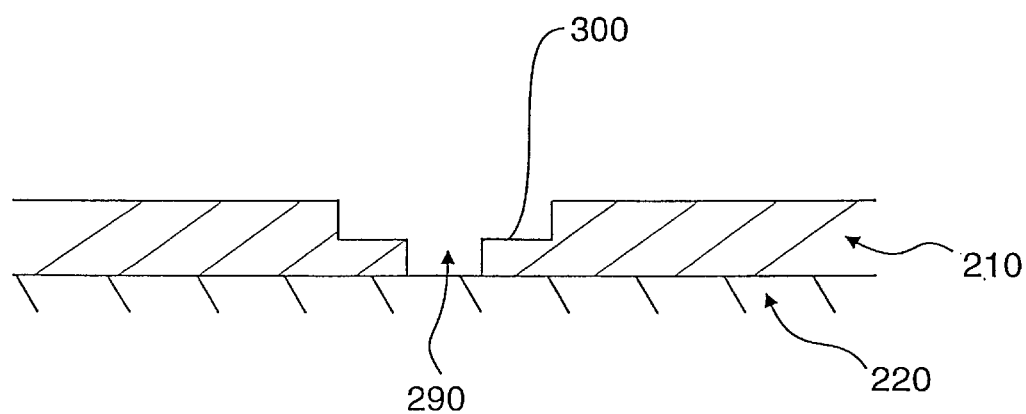
FIG. 14 is a fragmentary cross sectional view of the removal of the spacer and layer of polysilicon of FIG. 13.

The portion of the layer 210 not covered by the spacer 280 are then etched using conventional anisotropic etching techniques to form an opening 290 defining a pore in the layer 210 extending to the layer 220 as shown in FIG. 13. The resulting opening 290 may have a minimum lateral dimension ranging from about 500 to 4000 Angstroms, and preferably it will have a minimum lateral dimension of approximately 1000 Angstroms. The minimum lateral dimension of the opening 290 is defined by the selected thickness of the layer 270 used in forming the spacer 280. The spacer 280 and layer 230 are then removed using conventional etching techniques as shown in FIG. 14. The disposable spacer 280 thus provides a means of defining the minimum lateral dimension of an ultra-small pore in the layer 210. The second preferred embodiment of the present method thus provides a means of fabricating an ultrasmall pore 290 in the layer 210 by use of a disposable spacer 280 positioned adjacent to an edge feature of the layer 230.

Figure 15:
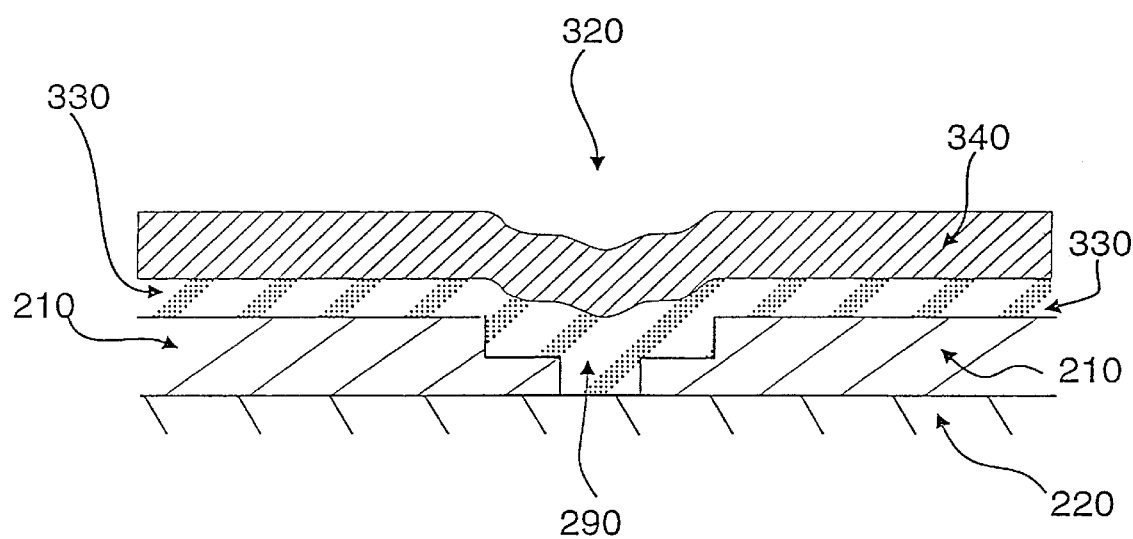
FIG. 15 is a fragmentary cross sectional view of the formation of chalcogenide memory cell using the structure illustrated in FIG. 14.

The resulting structure illustrated in FIG. 14 includes a conductive substrate 220 and a dielectric layer 210 including the opening 290 surrounded by a recess 300. The resulting structure illustrated in FIG. 14 including the opening 290 may also be provided, without the recess 300 in the layer 210, where the etch selectivities of the previous processes avoid etching the recess 300 in the layer 210. This structure is preferably used to fabricate a chalcogenide memory cell 320 in which the opening 290 provides a pore for the memory cell 320 as shown in FIG. 15. The memory cell 320 is fabricated by depositing a layer 330 of a chalcogenide material onto the layer 210 and into the opening 290 and recess 300 using conventional thin film deposition techniques. A layer 340 of a conductive material such as, for example, titanium nitride is then deposited over the layer 330 using conventional thin film deposition techniques. The layer 340 may comprise a conductive material such as, for example, TiN, carbon, or TiW, and preferably it will comprise TiN. The layer 330 of chalcogenide material will comprise the chalcogenide compositions previously discussed with reference to the first preferred embodiment.

Note that while a range of materials may be utilized for each of the layers, the particular materials selected for each of the layers must be selected to provide proper selectivity during the various etching processes as will be recognized by persons of ordinary skill in the art.

Figure 16:
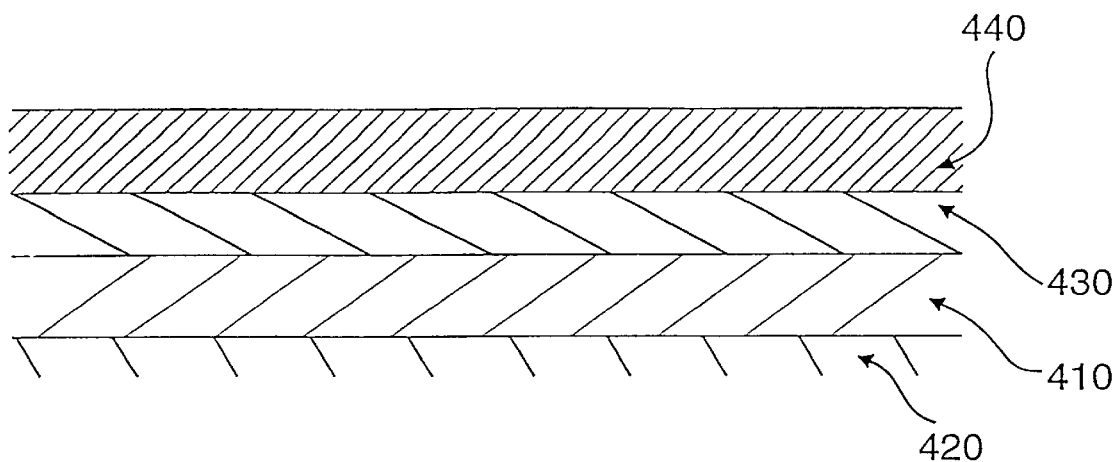
FIG. 16 is a fragmentary cross sectional view of the deposition of layers of silicon nitride, silicon dioxide, and polysilicon onto a substrate of titanium nitride in accordance with a third preferred embodiment of the present invention.

Referring to FIGS. 16 to 23, a third preferred embodiment of a method of fabricating ultra-small pores will now be described. A layer 410 of silicon nitride is first deposited onto a substrate 420 of titanium nitride. Layers 430 of silicon dioxide and 440 of polysilicon are then successively deposited onto the layer 410. The layers 410, 430, and 440 are deposited using conventional thin film deposition techniques as shown in FIG. 16. The layer 410 may have a substantially uniform thickness ranging from about 100 to 1000 Angstroms, and preferably it will have a substantially uniform thickness of approximately 500 Angstroms. The layer 410 may be comprised of a dielectric material such as, for example, silicon nitride, TEOS oxide, or PECVD oxide, and preferably it will be comprised of silicon nitride. The layer 430 may have a substantially uniform thickness ranging from about 100 to 1500 Angstroms, and preferably it will have a substantially uniform thickness of approximately 700 Angstroms. The layer 430 may be comprised of TEOS oxide or PECVD oxide, and preferably it will be comprised of TEOS oxide. The layer 440 may have a substantially uniform thickness ranging from about 2000 to 5000 Angstroms, and preferably it will have a substantially uniform thickness of approximately 4000 Angstroms. The layer 440 may be comprised of polysilicon, TEOS oxide, or PECVD oxide, and preferably will be comprised of polysilicon. The substrate 420 may be comprised of a conductive material such as, for example, TiN, carbon, $WSi_x$, or TiW, and preferably will be comprised of TiN.

Figure 17:
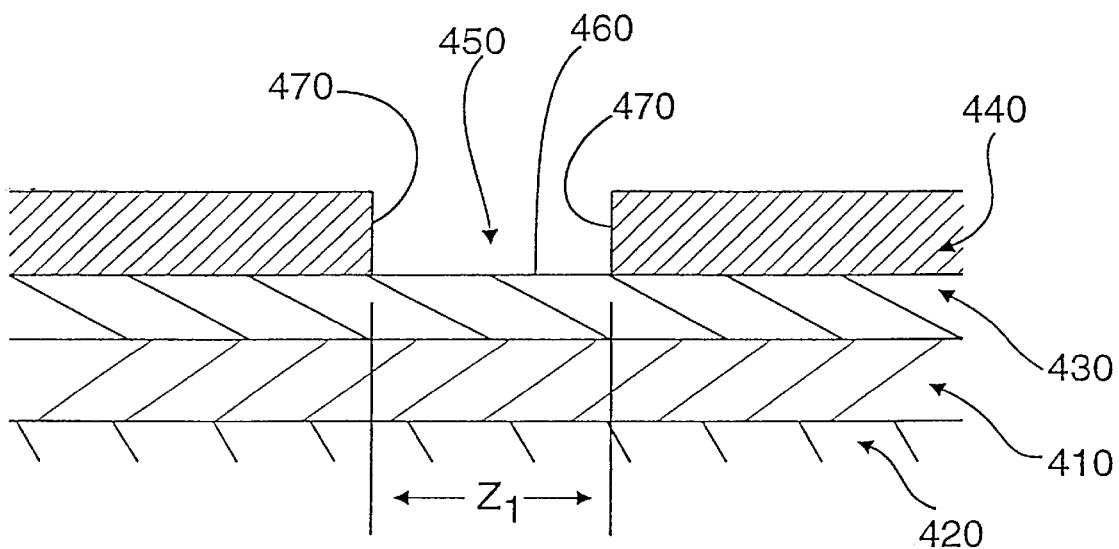
FIG. 17 is a fragmentary cross sectional view of the formation of an opening in the layer of polysilicon of FIG. 16.

An opening 450, extending downward to the layer 430, is then etched in the layer 440 using conventional anisotropic etching and masking techniques as shown in FIG. 17. The composition of the layer 430 is selected to prevent any material within the layer 410 from being etched away by this process. The opening 450 may be formed, for example, as a rectangular channel or as a substantially circular opening in the layer 440. The opening 450 is preferably formed using a conventional contact hole mask resulting in a substantially circular opening. The minimum lateral dimension $z_1$ of the opening 450 may range from about 2500 to 8000 Angstroms, and preferably it will be approximately 5000 Angstroms. The opening 450 includes a generally horizontal bottom surface 460 and generally vertical side walls 470 at its outer periphery.

Figure 18:
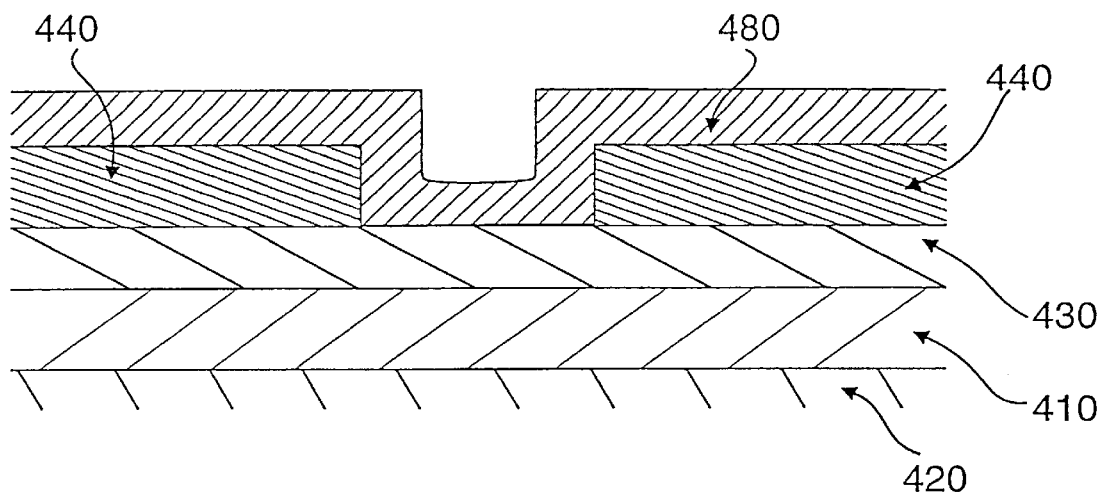
FIG. 18 is a fragmentary cross sectional view of the deposition of a second layer of polysilicon onto the first layer of polysilicon and into the opening in the first layer of polysilicon of FIG. 17.
Figure 19:
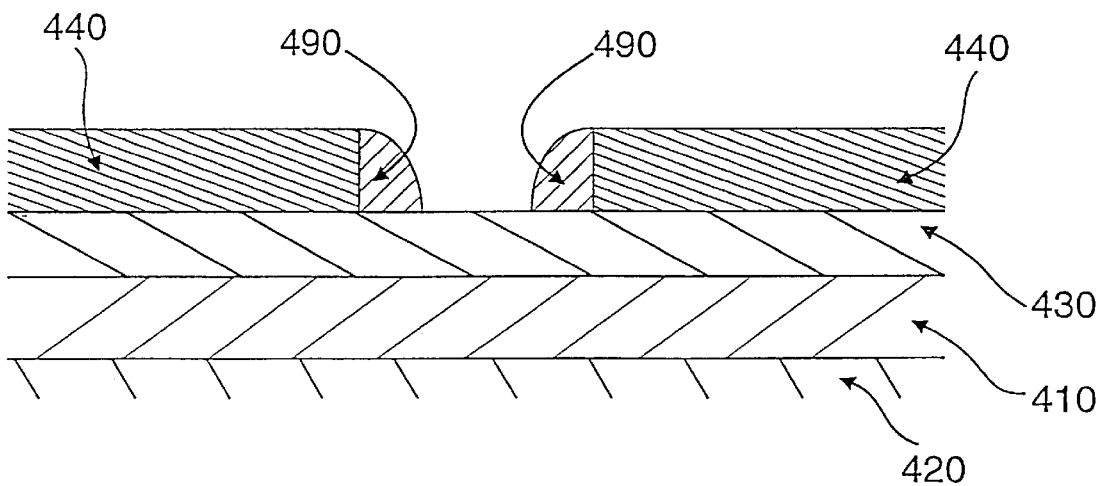
FIG. 19 is a fragmentary cross sectional view of the etching of the second layer of polysilicon of FIG. 18 to form a spacer.

A second layer 480 of polysilicon is then deposited onto the layer 440 and into the opening 450, onto the bottom surface 460 and side walls 470, using conventional thin film deposition techniques as shown in FIG. 18. The layer 480 may have a substantially uniform thickness ranging from about 500 to 3500 Angstroms, and preferably it will have a substantially uniform thickness of approximately 2000 Angstroms. The layer 480 may comprise polysilicon, TEOS oxide, or PECVD oxide, and preferably it will comprise polysilicon. The layer 480 is then etched using conventional anisotropic etching techniques to form a spacer 490 out of the layer 480 as shown in FIG. 19. The spacer 490 is positioned at the outer periphery of the opening 450 and covers the generally vertical side walls 470. The bottom of the spacer 490 will have a lateral thickness substantially equal to the selected thickness of the layer 480 provided that the layer 480 conformally coats the layer 440.

Figure 20:
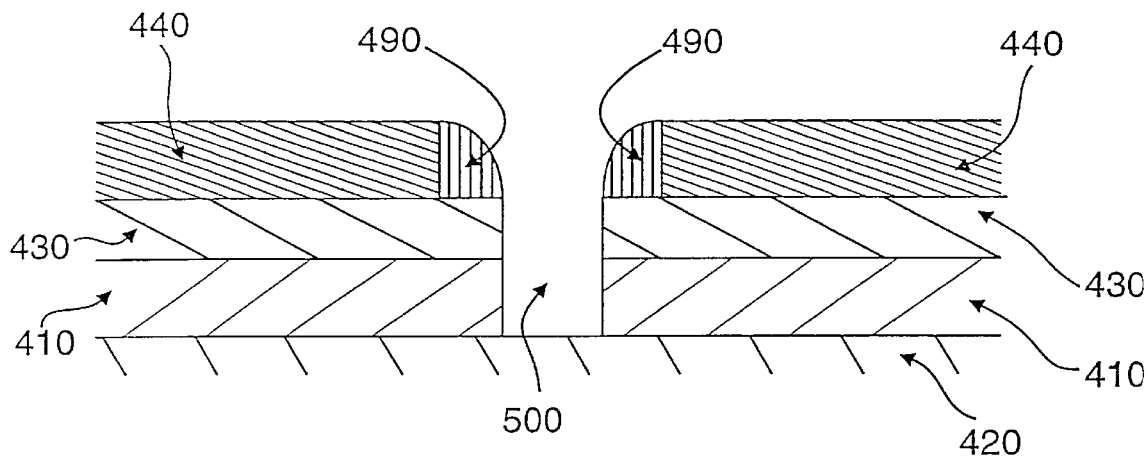
FIG. 20 is a fragmentary cross sectional view of the etching of the portions of the layers of silicon nitride and silicon dioxide circumscribed by the spacer of FIG. 19 to form an opening in the layers of silicon nitride and silicon dioxide.
Figure 21:
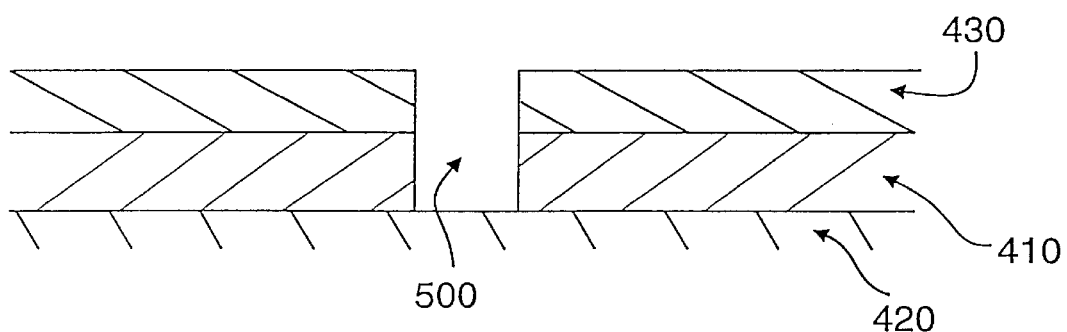
FIG. 21 is a fragmentary cross sectional view of the removal of the spacer and layers of silicon dioxide and polysilicon of FIG. 20.
Figure 22:
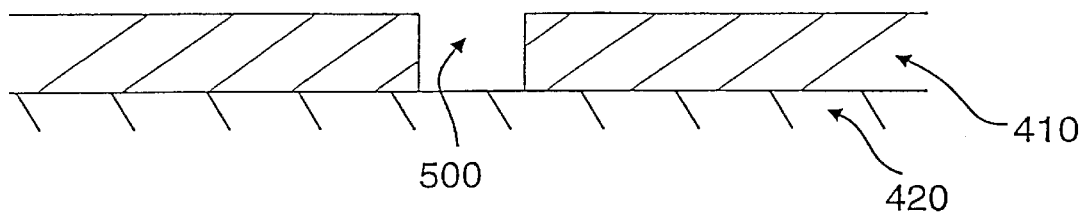
FIG. 22 is a fragmentary cross sectional view of the removal of the layer of silicon dioxide of FIG. 21.

The portions of the layers 410 and 430 not covered by the spacer 490 are then etched using conventional anisotropic etching techniques to form an opening 500 defining a pore in the layers 410 and 430 extending to the layer 420 as shown in FIG. 20. The resulting opening 500 may have a minimum lateral dimension ranging from about 500 to 4000 Angstroms, and preferably it will have a minimum lateral dimension of approximately 1000 Angstroms. The minimum lateral dimension of the opening 500 is defined by the selected thickness of the layer 480. The spacer 490, layer 440, and layer 430 are then removed using conventional etching techniques as shown in FIGS. 21 and 22. The disposable spacer 490 thus provides a means of defining an ultra-small pore in the layers 410 and 430. The third preferred embodiment of the present method thus provides a means of fabricating an ultra-small pore 500 in the layers 410 and 430 by use of the disposable spacer 490 positioned adjacent to an edge feature of the layer 440.

Note that while a range of materials may be utilized for each of the layers, the particular materials selected for each of the layers must be selected to provide proper selectivity during the various etching processes as will be recognized by persons of ordinary skill in the art.

Figure 23:
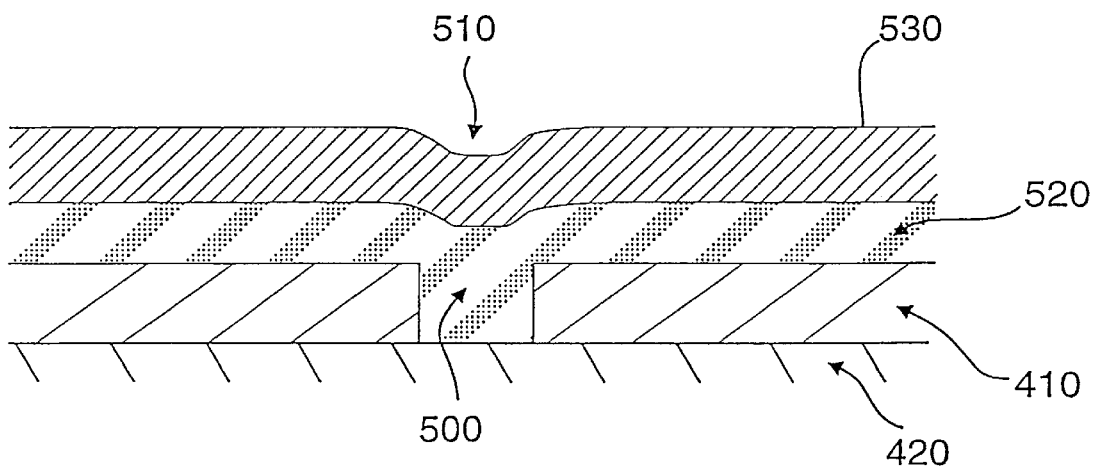
FIG. 23 is a fragmentary cross sectional view of the formation of chalcogenide memory cell using the structure illustrated in FIG. 22.

The resulting structure illustrated in FIG. 22 includes a conductive substrate 420 and a dielectric layer 410 including the opening 500. This structure is preferably used to fabricate a chalcogenide memory cell 510 in which the opening 500 provides a pore for the memory cell 510 as shown in FIG. 23. The memory cell 510 is fabricated by depositing a layer 520 of a chalcogenide material onto the layer 410 and into the opening 500 using conventional thin film deposition techniques. A layer 530 of a conductive material such as, for example, titanium nitride is then deposited over the layer 520 using conventional thin film deposition techniques. The layer 530 may comprise a conductive material such as, for example, TiN, carbon, or TiW, and preferably it will comprise TiN. The layer 520 of chalcogenide material will comprise the chalcogenide compositions previously discussed with reference to the first preferred embodiment.

A method has been described for forming ultra-small pores for use in chalcogenide memory cells using disposable internal spacers. More generally, the present method will also provide ultra-small contacts or vias in semiconductor devices such as, for example, static random access and dynamic random access memories. Such semiconductor devices require contacts to permit electrical connection to active regions of memory elements. The present method of forming ultra-small pores will also provide ultra-small contacts or vias in semiconductor devices generally thereby permitting further reduction in the physical size of such devices.

While the invention is susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the appended claims.

What is claimed is:

1. A method of fabricating a pore, comprising:
    applying a layer of a first material onto a substrate material;
    forming an edge feature in said layer of said first material;
    applying a layer of a second material onto said edge feature of said layer of said first material;
    applying a layer of a third material onto said layer of said second material;
    removing a portion of said layer of said third material; and
    removing a portion of said layer of said second material to define a pore in said layer of said second material.

2. The method of claim 1, wherein forming an edge feature in said layer of said first material comprises removing a portion of said layer of said first material to define an opening in said layer of said first material.

3. The method of claim 2, wherein said opening extends to said substrate material.

4. The method of claim 1, wherein removing a portion of said third material comprises:
    removing a portion of said layer of said third material to define a remaining portion of said layer of said third material.

5. The method of claim 4, wherein removing a portion of said layer of said second material to define a pore in said layer of said second material comprises removing a portion of said layer of said second material not covered by said remaining portion of said layer of said third material.

6. The method of claim 5, further comprising removing said remaining portion of said layer of said third material.

7. A method of fabricating a pore, comprising:

applying a layer of a first material onto a substrate material;

applying a layer of a second material onto said layer of said first material;

forming an edge feature in said layer of said second material;

forming an edge feature in said layer of said first material;

applying a layer of a third material onto said edge features of said layers of said first and second materials;

removing a portion of said layer of said third material; and removing a portion of said layer of said first material to define a pore in said layer of said first material.

8. The method of claim 7, wherein forming an edge feature in said layer of said second material comprises removing a portion of said layer of said second material to define an opening in said layer of said second material.

9. The method of claim 8, wherein said opening extends to said layer of said first material.

10. The method of claim 7, wherein removing a portion of said layer of said third material comprises:

removing a portion of said layer of said third material to define a remaining portion of said layer of said third material.

11. The method of claim 10, wherein removing a portion of said layer of said first material to define a pore in said layer of said first material comprises removing a portion of said layer of said first material not covered by said remaining portion of said layer of said third material.

12. The method of claim 11, further comprising removing said remaining portion of said layer of said third material.

13. A method of fabricating a pore, comprising:

applying a layer of a first material onto a substrate material;

applying a layer of a second material onto said layer of said first material;

applying a layer of a third material onto said layer of said second material;

forming an edge feature in said layer of said third material;

applying a layer of a fourth material onto said edge feature of said layer of said third material;

removing a portion of said layer of said fourth material;

removing a portion of said layer of said second material to define a pore in said layer of said second material; and removing a portion of said layer of said first material to define a pore in said layer of said first material.

14. The method of claim 13, wherein forming an edge feature in said layer of said third material comprises removing a portion of said layer of said third material to define an opening in said layer of said third material.

15. The method of claim 14, wherein said opening extends to said layer of said second material.

16. The method of claim 13, wherein removing a portion of said fourth material comprises:

removing a portion of said layer of said fourth material to define a remaining portion of said layer of said fourth material.

17. The method of claim 16, wherein removing a portion of said layer of said second material to define a pore in said layer of said second material comprises removing a portion of said layer of said second material not covered by said remaining portion of said layer of said fourth material.

18. The method of claim 16, wherein removing a portion of said layer of said first material to define a pore in said layer of said first material comprises removing a portion of said layer of said first material not covered by said remaining portion of said layer of said fourth material.

19. The method of claim 18, further comprising removing said remaining portion of said layer of said fourth material.

20. A method of fabricating a chalcogenide memory cell, comprising:

applying a layer of a first material onto a conductive substrate material;

forming an edge feature in said layer of said first material;

applying a layer of a insulative material onto said edge feature of said layer of said first material;

applying a layer of a third material onto said layer of said insulative material;

removing a portion of said layer of said third material;

removing a portion of said layer of said insulative material to define a pore in said layer of said insulative material;

applying a layer of a chalcogenide material into said pore; and applying a layer of a conductive material onto said layer of said chalcogenide material.

21. The method of claim 20, wherein forming an edge feature in said layer of said first material comprises removing a portion of said layer of said first material to define an opening in said layer of said first material.

22. The method of claim 21, wherein said opening extends to said substrate material.

23. The method of claim 20, wherein removing a portion of said layer of said third material comprises:

removing a portion of said layer of said third material to define a remaining portion of said layer of said third material.

24. The method of claim 23, wherein removing a portion of said layer of said insulative material to define a pore in said layer of said insulative material comprises removing a portion of said layer of said insulative material not covered by said remaining portion of said layer of said third material.

25. The method of claim 24, further comprising removing said remaining portion of said layer of said third material.

26. A method of fabricating a chalcogenide memory cell, comprising:

applying a layer of a insulative material onto a conductive substrate material;

applying a layer of a second material onto said layer of said insulative material;

forming an edge feature in said layer of said second material;

forming an edge feature in said layer of said insulative material;

applying a layer of a third material onto said edge features of said layers of said insulative and second materials;

removing a portion of said layer of said third material;

removing a portion of said layer of said insulative material to define a pore in said layer of said insulative material;

applying a layer of a chalcogenide material into said pore; and applying a layer of a conductive material onto said layer of said chalcogenide material.

27. The method of claim 26, wherein forming an edge feature in said layer of said second material comprises removing a portion of said layer of said second material to define an opening in said layer of said second material.

28. The method of claim 27, wherein said opening extends to said layer of said insulative material.

29. The method of claim 26, wherein removing a portion of said layer of said third material comprises:

removing a portion of said layer of said third material to define a remaining portion of said layer of said third material.

30. The method of claim 26, wherein removing a portion of said layer of said insulative material to define a pore in said layer of said insulative material comprises removing a portion of said layer of said insulative material not covered by said remaining portion of said layer of said third material.

31. The method of claim 30, further comprising removing said remaining portion of said layer of said third material.

32. A method of fabricating a chalcogenide memory cell, comprising:

applying a layer of an insulative material onto a conductive substrate material;

applying a layer of a second material onto said layer of said insulative material;

applying a layer of a third material onto said layer of said second material;

forming an edge feature in said layer of said third material;

applying a layer of a fourth material onto said edge feature of said layer of said third material;

removing a portion of said layer of said fourth material;

removing a portion of said layer of said second material to define a pore in said layer of said second material;

removing a portion of said layer of said insulative material to define a pore in said layer of said insulative material;

applying a layer of a chalcogenide material into said pore in said layer of said insulative material; and applying a layer of a conductive material onto said layer of said chalcogenide material.

33. The method of claim 32, wherein forming an edge feature in said layer of said third material comprises removing a portion of said layer of said third material to define an opening in said layer of said first material.

34. The method of claim 33, wherein said opening extends to said layer of said second material.

35. The method of claim 32, wherein removing a portion of said layer of said fourth material comprises:

removing a portion of said layer of said fourth material to define a remaining portion of said layer of said fourth material.

36. The method of claim 35, wherein removing a portion of said layer of said second material to define a pore in said layer of said second material comprises removing a portion of said layer of said second material not covered by said remaining portion of said layer of said fourth material.

37. The method of claim 35, wherein removing a portion of said layer of said insulative material to define a pore in said layer of said insulative material comprises removing a portion of said layer of said insulative material not covered by said remaining portion of said layer of said fourth material.

38. The method of claim 37, further comprising removing said remaining portion of said layer of said fourth material.

* * * * *